United States Patent [19]

Zejda et al.

[11] Patent Number: 4,984,531

[45] Date of Patent: Jan. 15, 1991

[54] DEVICE FOR ACCEPTING AND HOLDING A WORKPIECE IN VACUUM COATING APPARATUS

[75] Inventors: Jaroslav Zejda, Rodenbach; Manfred Schuhmacher, Alzenau-Michelbach, both of Fed. Rep. of Germany

[73] Assignee: Leybold Aktiengesellschaft, Fed. Rep. of Germany

[21] Appl. No.: 419,706

[22] Filed: Oct. 11, 1989

[30] Foreign Application Priority Data

Apr. 14, 1989 [DE] Fed. Rep. of Germany ....... 3912296

[51] Int. Cl.$^5$ .............................................. B05C 3/09
[52] U.S. Cl. ...................................... 118/50; 118/730; 204/298.23; 204/298.28
[58] Field of Search ................. 118/50, 719, 729, 730; 204/298.23, 298.28

[56] References Cited

U.S. PATENT DOCUMENTS

| | | | |
|---|---|---|---|
| 2,432,950 | 12/1947 | Turnek et al. | 118/730 |
| 3,023,727 | 3/1962 | Theodoseau et al. | 118/730 |
| 3,532,072 | 10/1970 | Kiwiet | 118/301 |
| 3,904,930 | 9/1975 | Waldron et al. | 118/622 |
| 3,991,707 | 11/1976 | Thelen et al. | 118/730 |
| 4,500,407 | 2/1985 | Boys et al. | 118/724 |
| 4,685,852 | 8/1987 | Rubin et al. | 118/729 |
| 4,687,542 | 8/1987 | Davis et al. | 118/729 |
| 4,770,590 | 9/1988 | Hughues et al. | 29/407 |
| 4,808,291 | 2/1989 | Denton et al. | 118/729 |

FOREIGN PATENT DOCUMENTS

| | | |
|---|---|---|
| 3306870 | 6/1984 | Fed. Rep. of Germany . |
| 3413001 | 10/1985 | Fed. Rep. of Germany . |
| 3717712 | 12/1988 | Fed. Rep. of Germany . |
| 1028371 | 1/1989 | Japan ................................... 118/730 |
| 500768 | 2/1971 | Switzerland . |

Primary Examiner—Willard Hoag
Attorney, Agent, or Firm—Hill, Van Santen, Steadman & Simpson

[57] ABSTRACT

A vacuum coating device having a workpiece carrier rotatably positioned within the process chamber including a device for positioning and releasably securing the workpiece on the carrier comprising a crank-lever mechanism positioned at a transfer station and a clamping mechanism positioned on the carrier. The crank lever mechanism operatively engages the clamping mechanism to release or secure a workpiece on the carrier.

20 Claims, 9 Drawing Sheets

DEVICE FOR ACCEPTING AND HOLDING A WORKPIECE IN VACUUM COATING APPARATUS

BACKGROUND OF THE INVENTION

The present invention generally is directed to vacuum coating systems. More specifically, the invention is directed to a device for accepting and holding workpieces in a workpiece carrier of a vacuum coating system, wherein the workpiece carrier is positioned within a process chamber of the system so as to convey the workpiece from position-to-position within the process chamber.

The coating of workpieces, for example, compact disks (CD's) is known in vacuum coating technology, particularly in thin film coating technology. Compact disks are a modern storage medium for digital information. Imprinted plastic disks are sputter coated with a layer, for example, an aluminum layer having a thickness of less than 1/10,000 mm.

The sputtering coating systems utilized for this purpose generally include annularly constructed process chambers. Robots load and unload the systems in clean rooms via transfer (loading and unloading) station airlocks. Workpiece carriers convey the workpieces from the airlocks through the annular process chambers. Sputtering ensues with high power sputtering cathodes that are constructed as magnatron cathodes.

Such a system is described in a brochure numbered 12-710.01 produced by Leybold-Heraeus GmbH. This known cathode sputtering system provides single-sided coating of a workpiece with a laser-reflecting aluminum layer. The system employs an annular-horizontally arranged vacuum coating chamber with a loading and unloading station and a ring-shaped turntable which serves as the workpiece carrier. An airlock isolates the pressures between the coating chamber and the loading and unloading station.

SUMMARY OF THE INVENTION

The present invention provides an improved vacuum coating system. More specifically, the invention provides a device for precisely positioning and releasably securing a workpiece on a carrier. Yet more specifically, the invention provides a workpiece carrier With a clamping mechanism that positions and releasably secures a workpiece on the carrier, and a crank-lever mechanism positioned at a transfer station that cooperates with the clamping mechanism to selectively actuate same to release or secure a workpiece.

To these ends, in an embodiment, the invention provides a sputter coating system, wherein a workpiece carrier is positioned with a process chamber of the system to convey a workpiece to one or more stations, including a device for accepting and holding workpieces on the workpiece carrier comprising a crank lever mechanism mounted on the process chamber and positioned at a loading and unloading station and a clamping mechanism located on the workpiece carrier, the crank lever mechanism and the clamping mechanism operatively registering in position when the workpiece carrier positions the workpiece at a loading and unloading station, the crank lever mechanism operatively interacting with the clamping mechanism to clamp and/or release the workpiece.

In a preferred embodiment, the crank lever mechanism comprises a rotatable plate that acts as a crank and to which at least three tension and compression rods are pivotally attached, each rod actuating a clamping member of the clamping mechanism via a double pivot lever with a central fulcrum, i.e., a seesaw lever.

Yet further, each clamping member preferably comprises a lever that is pivotally attached to the workpiece carrier and that is biased so as to exert a clamping force on the workpiece. Each rod actuates its respective clamping member via its associated seesaw type lever to exert a force overcoming the bias of the lever associated therewith.

Preferably, the clamping mechanism comprises three clamping members positioned at equal intervals about a receptacle opening in the workpiece carrier.

An advantage of the present invention is a device for precisely positioning a workpiece on a carrier.

Another advantage is that parts of the device for accepting and holding a workpiece on a carrier do not displace relative to one another so that no frictional by-products are produced and thus, no impurities created.

Yet another advantage of the invention is a device, wherein the actuation of the clamping forces on a workpiece are undertaken via efficient means with minimal movement.

These and other advantages will become apparent from the following description of the preferred embodiments thereof, taken in conjunction with the accompanying drawings.

DETAILED DESCRIPTION OF THE PRESENTLY PREFERRED EMBODIMENTS

Figure 1:
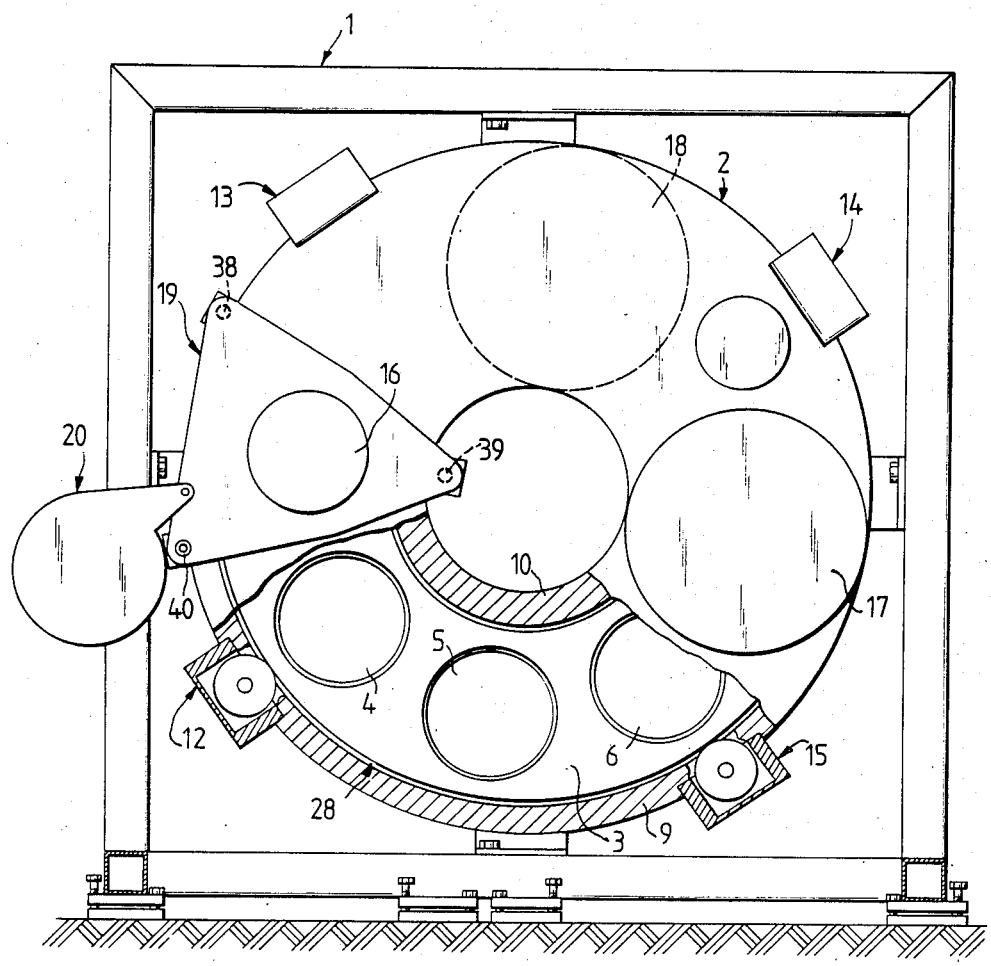
FIG. 1 illustrates in elevational view a cathode sputtering system embodying principles of the invention looking generally in the direction of the arrow I in FIG. 2.

In FIG. 1 there is illustrated a cathode sputtering system 2 mounted within a stand or frame 1. As illustrated, the system 2 includes an annular process chamber 28. The process chamber 28 is placed under vacuum pressure to enable vacuum coating of workpieces.

In FIG. 1, the process chamber 28 is illustrated in a partially broken away view so that a workpiece carrier (turntable) 3 that rotates within the process chamber 28 can be seen. The workpiece carrier 3 is adapted for accepting workpieces within receptacles 4, 5, and 6.

Figure 2:
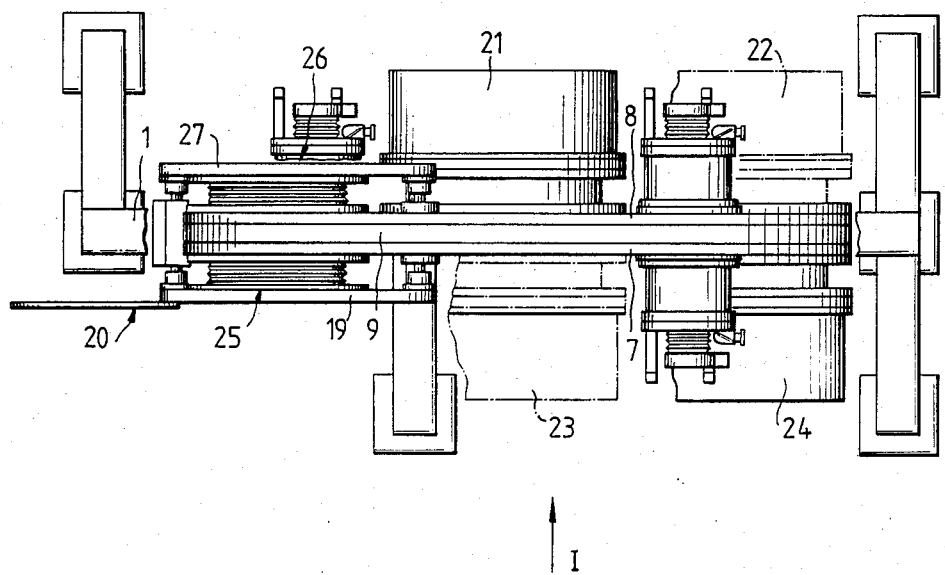
FIG. 2 is a plan view of the system of FIG. 1.

In cross-section, the annular process chamber 28 is rectangular. This is best illustrated in FIG. 2. The rectangular shape is defined by two vertically positioned walls 7 and 8 connected to each other via an outer annular wall 9 and an inner annular wall 10 (illustrates in FIG. 1). In FIG. 1, the outer and inner annular walls 9 and 10, respectively, are illustrated in hatched cross-section.

Figure 3:
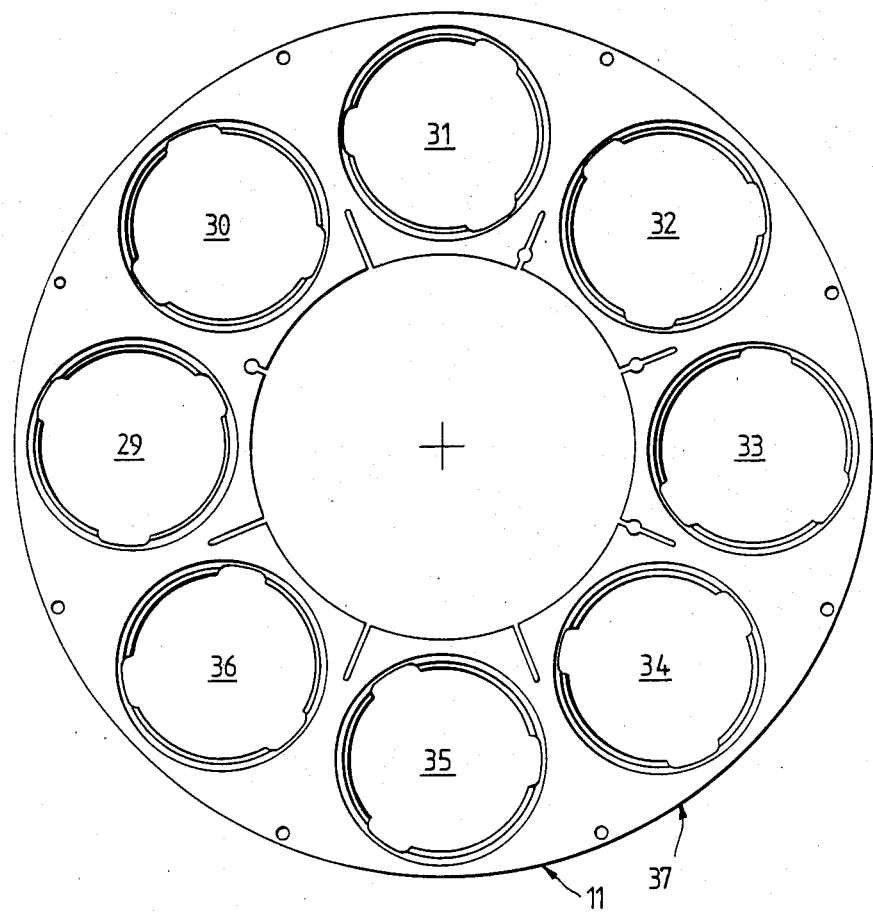
FIG. 3 illustrates a ring conveyor employed in the system of FIG. 1.

As illustrated best in FIG. 3, the workpiece carrier 3 comprises a ring-shaped turntable conveyor 11 that conforms in shape to the interior of the process chamber 28. The ring conveyor 11 is operatively rotated within the process chamber 28 by means of appropriate drive mechanisms 12, 13, 14, and 15 that engage an outer periphery of the ring 11.

The system 2 further includes a loading and unloading station located at 16 in FIG. 1. Similarly, the system 2 includes cathode stations at 17 and 18. In FIG. 2, four cathodes 21, 22, 23, and 24 are illustrated at positions 17 and 18. Two portions 25 and 26 of a transfer station, are illustrated at position 16.

From FIG. 3, it can be seen that the ring conveyor 11 comprises eight receptacle openings 29, 30, 31, 32, 33, 34, 35, and 36. Retaining devices, not illustrated in FIG. 3, are positioned within these receptacle openings to retain workpieces therein. As the ring conveyor 11 rotates, these workpieces are conveyed from position-to-position within the process chamber 28. For example, the workpieces can be conveyed from the loading and unloading station at 16 to the cathode station at 18 and 17 and then back again.

Figure 4:
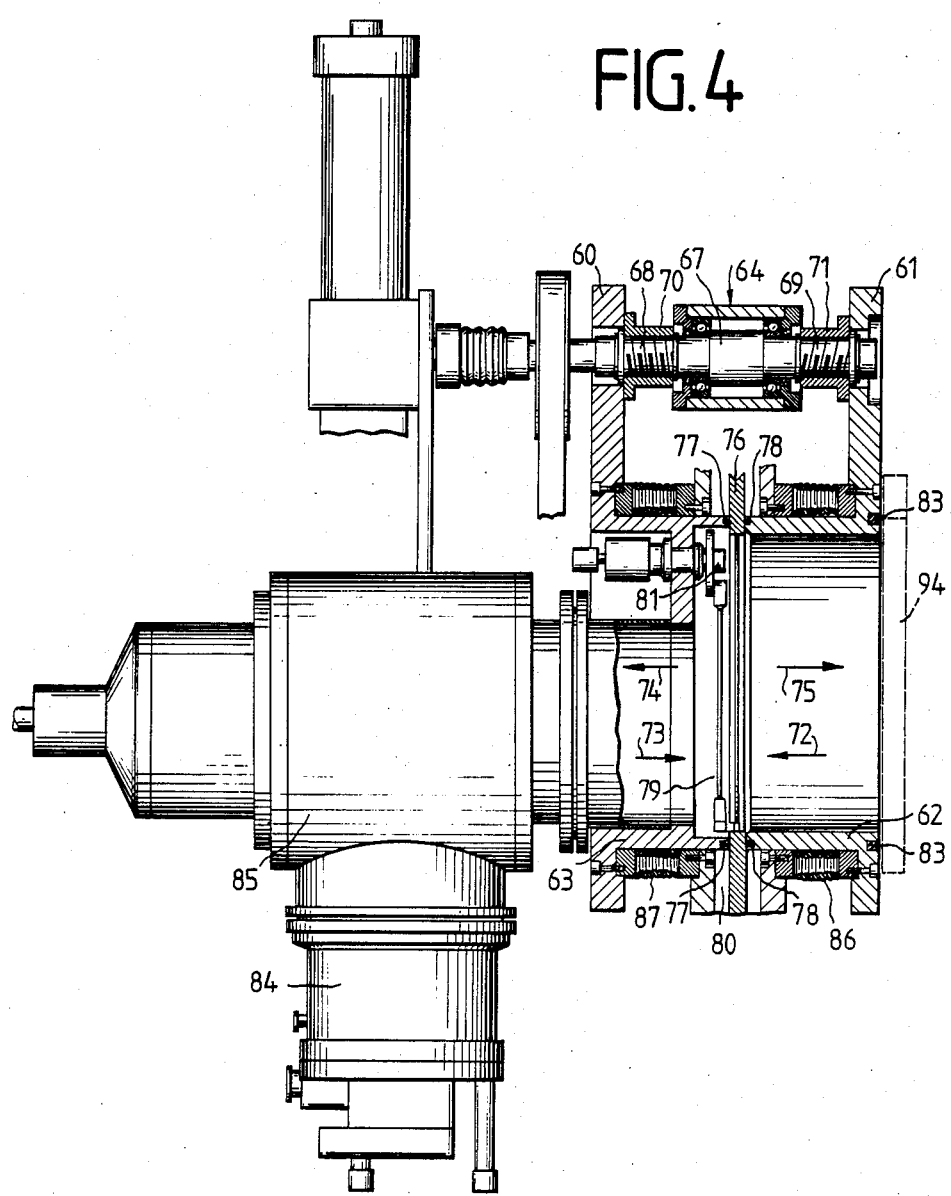
FIG. 4 illustrates a loading and unloading station employed in connection with the system of FIG. 1.

In FIG. 4, the loading and unloading station is illustrated in greater detail. As illustrated, the station comprises two plate shaped flanges 60 and 61. These flanges function as pressing elements, i.e., they are selectively urged toward and away from each other so as to press components therebetween.

The flanges 60 and 61 are illustrated most clearly in FIGS. 1 and 2 as plates designated 27 and 19, respectively. The flanges have a triangular profile and include an actuating pressing mechanism located in each corner. Only one such mechanism is illustrated and it bears the reference numeral 64. However, the three positions at which such mechanism are located bear reference numerals 38, 39, and 40.

With further reference to FIG. 4, it can be seen that connecting sleeves 62 and 63 are positioned between the flanges 60 and 61 and the process chamber 28. Sleeve 62 is positioned between flange 61 and the chamber 28. Sleeve 63 is positioned between the flange 60 and the process chamber 28.

Each flange and sleeve combination is constructed as a unitary member. Accordingly, the flange comprises a flange that extends from the sleeve.

The pressing mechanism 64 is representative of the pressing mechanisms not illustrated. The mechanism 64 includes a spindle 67 having a left hand threaded end 68 and a right hand threaded end 69. The threaded ends 68 and 69 operatively engage nuts 70 and 71, respectively attached to the flanges 60 and 61, respectively. the flanges 60 and 61 will move toward or away from each other. Accordingly, the sleeves 62 and 63 will also move toward or away from each other, depending on the direction in which the spindle 67 is rotated.

If the spindle 67 is rotated in a clockwise direction, the pressing members defined by the flanges 60 and 61 and the sleeves 63 and 62, respectively, will move toward each other in the direction of arrows 72 and 73. An opposite rotation will move the pressing members away from each other in the direction of the arrows 74 and 75.

In FIG. 4, the ring conveyor is identified by the numeral 76. As illustrated, two 0-rings 77 and 78 provide a vacuum tight seal between the ring conveyor 76 and the connecting sleeves 63 and 62, respectively.

When the sleeves 62 and 63 are pressed against the ring 76, they form a closed, cylindrical space that is separated from the remainder of the process chamber 28. This closed, cylindrical space functions as a transfer chamber for transferring a workpiece into (loading) and out from (unloading) the process chamber. The transfer chamber thus operates as an airlock 79, that can be isolated from the process chamber, now identified by the numeral 80.

When a workpiece is to be loaded into or unloaded from the process chamber, the transfer chamber is evacuated, i.e., placed under vacuum pressure. Subsequently, a workpiece is removed from the process chamber and a new workpiece inserted into the retaining device 81. The retaining device pertains to a system described more fully below, that accepts and retains workpieces on a workpiece carrier, as illustrated in FIGS. 5–10.

When a substrate is to be transferred into and out from the system as a whole, the transfer chamber is flooded, i.e., placed under atmospheric pressure.

Once a workpiece is retained within the carrier, the transfer chamber is sealed vacuum tight by means of a cover 94. An 0-ring 83 serves to provide the sealing between cover 94 and an end of the sleeve 62. A pump 84 is employed to evacuate the transfer chamber. A valve 85 provides for appropriate valving of the evacuation line. After vacuum pressure has been established, the sleeves 62 and 63 are made to move apart in the direction of the arrows 74 and 75.

As illustrated, the sleeves 62 and 63 are sealed from atmosphere by means of cylindrical membrane bellows 86 and 87, respectively. The seals 86 and 87 compress as the sleeves are pressed together and expand as the sleeves are moved apart.

It can be appreciated that when the connecting sleeves 62 and 63 are retracted after a workpiece has been transferred to the ring conveyor, the ring conveyor is permitted to rotate. Thus, the workpiece can be conveyed to a cathode station from the loading and unloading station.

A system for accepting and holding workpieces in the ring conveyor is illustrated in FIGS. 5–11. The system can be subdivided into a crank-lever mechanism that is attached and positioned at the loading and unloading station, at a connection sleeve 41 (FIG. 6), and a clamping mechanism comprising a plurality of workpiece clamping members (FIGS. 9 and 10), each of which is provided with a bearing block and which is located on the workpiece carrier.

Figure 5:
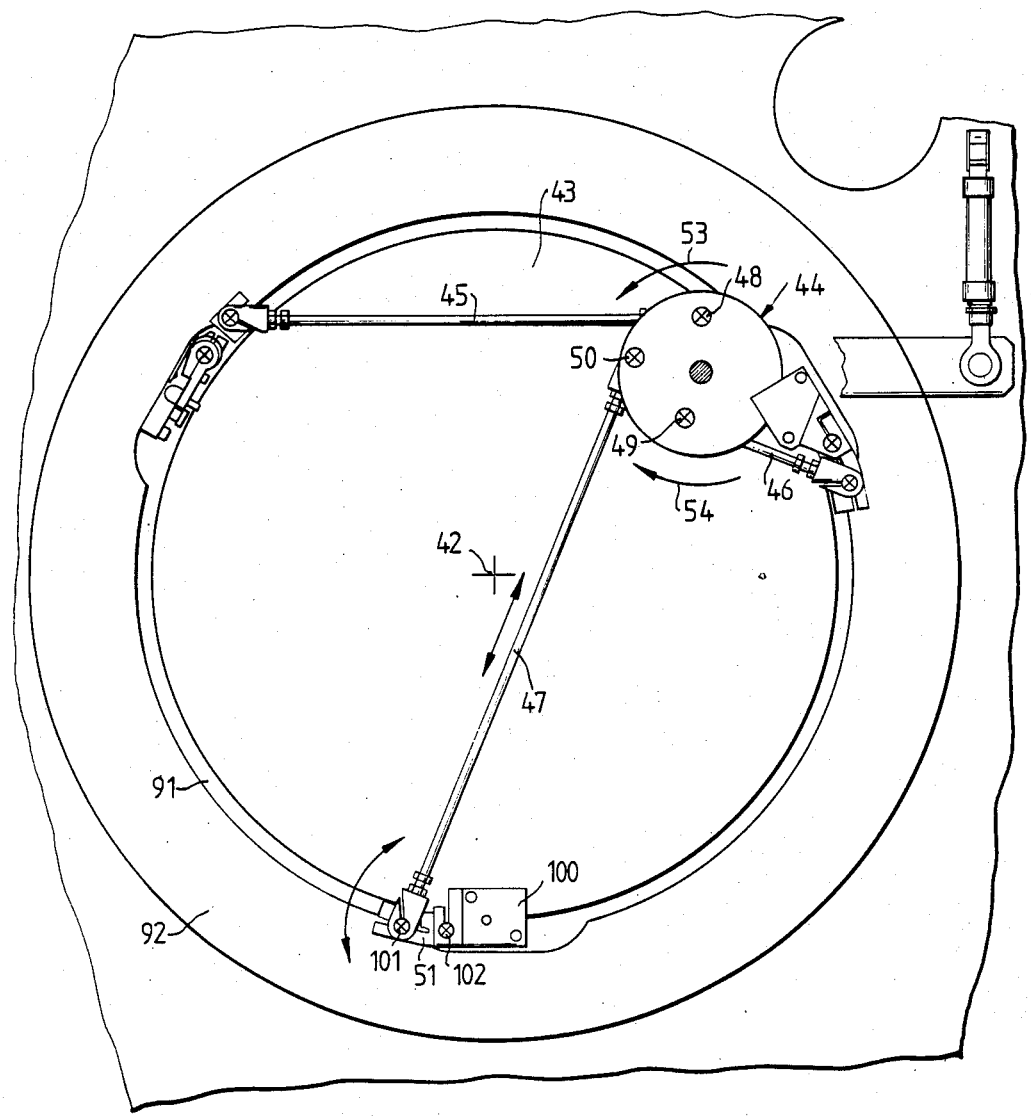
FIG. 5 illustrates a device for accepting and holding workpieces that embodies principles of the invention located in a workpiece carrier
Figure 6:
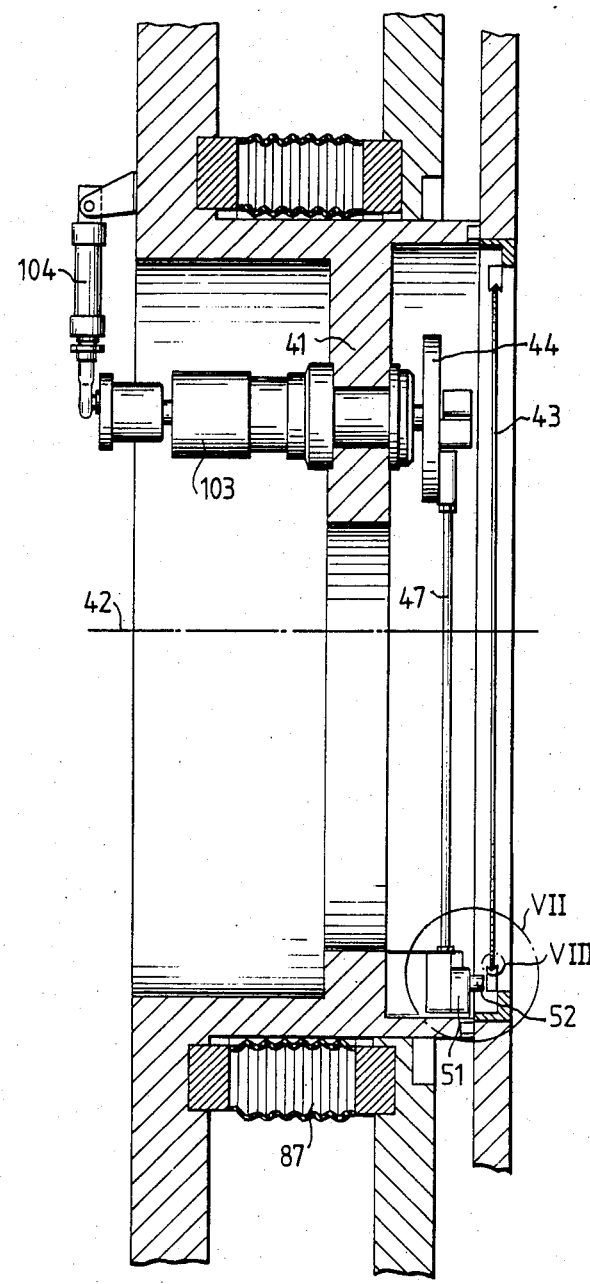
FIG. 6 illustrates the device of FIG. 5 in crosssectional view taken generally along the line VI—VI.

As illustrated in FIGS. 5 and 6, the crank-lever mechanism is arranged about an opening having a central axis 42 and which registers with a workpiece 43 when same is to be loaded or unloaded from the system. The crank-lever mechanism includes a crank plate 44 to which are attached three actuation rods 45, 46, and 47. The rods 45, 46, and 47 are also referred to as compression and tension rods because of the forces exerted thereon during actuation, as will become apparent below.

The rods 45, 46, and 47 are pivotally attached to the plate 44 at articulation points 48, 49, and 50. In the region of the periphery of the workpiece 43, the rods 45, 46, and 47 cooperate with seesaw type levers that are pivotally connected to the connecting sleeve 41 via central fulcrums.

It can be seen that the seesaw type levers which the rods 45, 46, and 47 actuate are positioned about the periphery of the opening at 120° intervals. One such seesaw type lever is identified by the numeral 51 in FIGS. 5, 6, 7, and 11.

The lever 51 (and the other such levers as well) includes a peg member 52 extending therefrom that can be actuated to press against a workpiece clamping member associated therewith (e.g., the cantilevered member 65). The peg member 52 thus acts as an actuator for the clamping member.

When the crank plate 44 is rotated in the direction of the arrow 53, i.e., counterclockwise, the three actuator rods 45, 46, and 47 are placed under compression and acts as pressure exerting rods. When the plate 44 is rotated in the opposite direction of the arrow 54, the rods 45, 46, and 47 are placed under tension and, accordingly, act as tension exerting rods.

Figure 11:
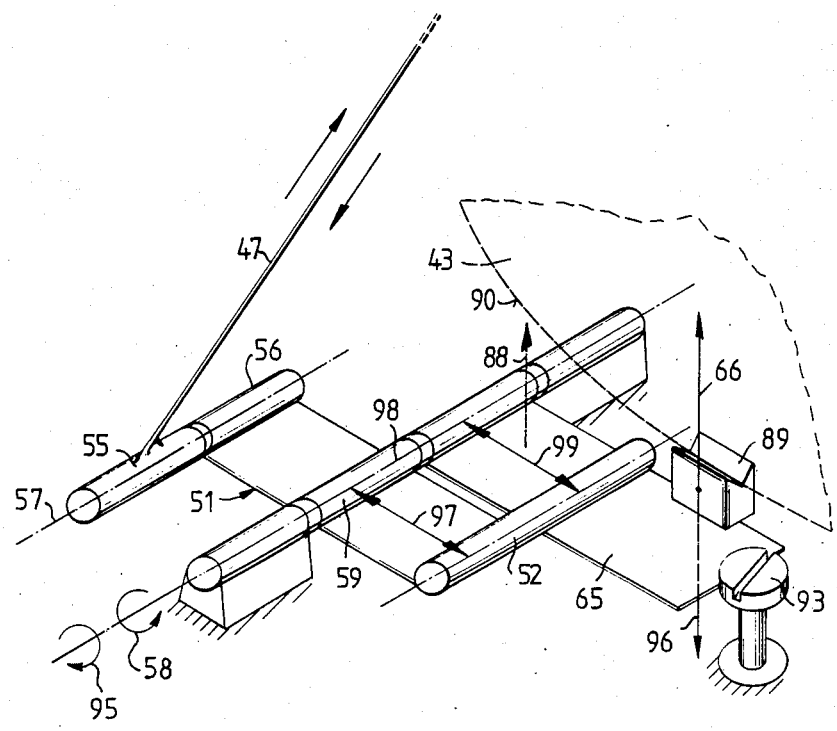
FIG. 11 is a schematic illustration depicting operation of the device.

With reference to FIG. 11, it can be seen that the actuation rod 47, in a manner similar to that of the other rods 45 and 46, can be made to press on a bearing portion 55. The bearing portion 55 and a bearing portion 56 have a common axis 57. The lever 51 pivots in the direction of the arrow 58 as a result of such pressure.

The peg member 52 that is attached to the seesaw type lever 51 can also be seen. The peg member 52 is positioned on a side of a bearing portion 59 opposite that on which is located the bearing portion 56. It can be appreciated that the peg member 52 is caused to move in an upward direction in the direction of the arrow 88 because the bearing portion serves as the central fulcrum or pivot point for the lever 51.

Figure 9:
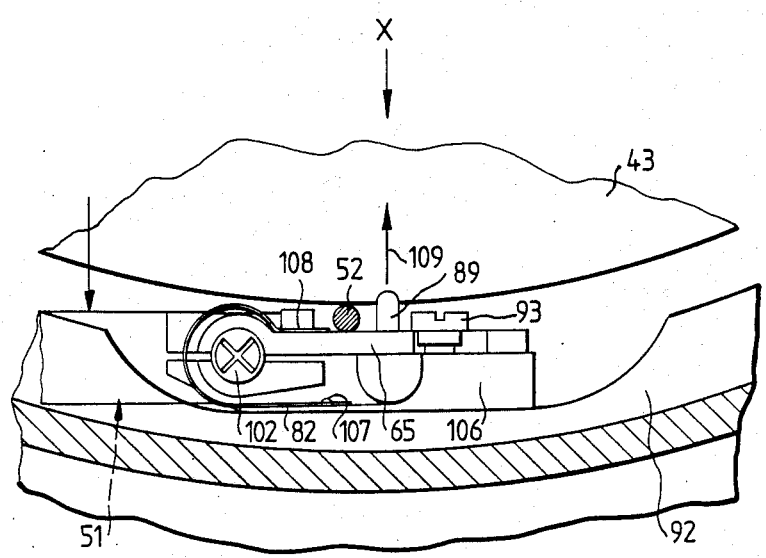
FIG. 9 is an illustration of a clamping mechanism illustrated in FIG. 5.
Figure 10:
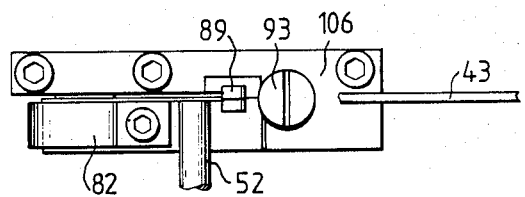
FIG. 10 illustrates the clamping mechanism of FIG. 9 looking in the direction of the arrow X of FIG. 9.

With reference particularly to FIGS. 9 and 11, it can be seen that upon actuation, a clamping cantilevered lever 65 is released and pivots in the direction of the arrow 66 due to the influence of a leaf spring 82 operatively attached thereto. The leaf spring 82 is pre-stressed. The pre-stress force is also indicated by the arrow 88 in FIG. 11.

As a result of the movement of the clamping lever 65, a hardened retainer member 89 is caused to move against an edge 90 of the workpiece 43 in the direction of the arrow 66. Accordingly, since three clamping devices of the type described are positioned about the periphery of the workpiece receptacle opening 91, the workpiece 43 is grasped at three points spaced about 120° apart and retained concentrically within the opening 91 of the carrier 92.

When the actuation rod 47 is caused to exert a tension force, the seesaw type lever 51 pivots in the direction of the arrow 95. The peg member 52 presses the lever 65 of the workpiece clamping member in the direction of the arrow 96, i.e., in the direction opposite that of the force of the leaf spring 82.

After the retaining member 89 is moved the predetermined distance in the direction of the arrow 96, the outer edge 90 of the workpiece 43 is released. At this time, the workpiece 43 can be removed from the carrier.

As can be appreciated from FIG. 11, the effective radius 97 of the lever 51 is the same distance as the effective radius 99 between the pivoting axis 98 of the lever 65 and the center line of the peg 52. This is due to the fact that the lever 51 and the lever 65 of the clamping member have the common pivoting axis 98. Due to the equality of the dimensions 97 and 99, no relative displacement occurs between the peg 52 and the lever 65 of the clamping member, i.e., no frictional engagement occurs. As a result, no abrasion particles are produced. Therefore, the cleanliness of the process chamber is kept to a high standard.

The described lever is referenced 51 in FIG. 5. It is illustrated seated in a bearing block 100.

All bearings accommodated in the process chamber for the device for accepting and holding these workpieces, thus, for example, the bearings at positions 49, 50, 48, 101, and 102 (see FIG. 5, as well as 102 FIG. 9) are referred to as frictionless flexural pivots.

Flexural pivots are known components; for example, see the brochure of Teldix GmbH, Heidebert, West Germany, bearing the designation 90.11/VIT 1.87 GD (3). A flexural pivot is composed of two concentric sleeves, wherein one can be turned inside the other. The sleeves, wherein one can be turned inside the other. The sleeves are connected to one another by two leaf springs that reside at a right angle relative to one another. Flexural pivots exert no friction between parts. Accordingly, they require no lubrication. Therefore, seizure of the bearings is nearly impossible.

The inventive utilization of known flexural pivots further assures that the standards of cleanliness of the atmosphere in the process chamber are met. No friction between cooperating bearing portions lessens the creation of frictional abrasion particles. Further lubrication contamination is eliminated.

In FIG. 6, a drive shaft 103 for the crank plate 44 can be seen. The shaft 103 is sealed therein vacuum-tight. Numeral 104 references the drive mechanism for the crank plate 44.

Figure 7:
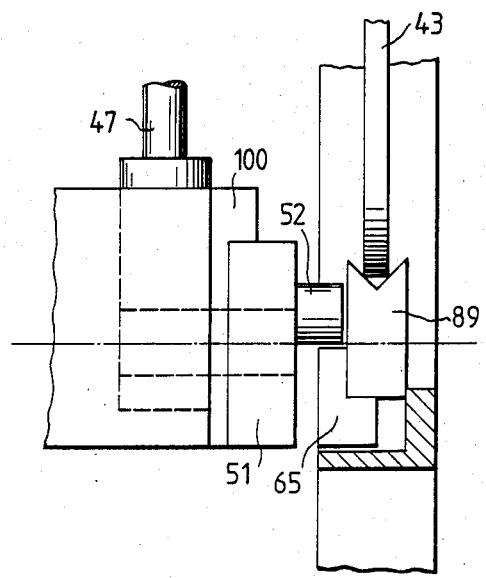
FIG. 7 is a detailed illustration of the device of FIG. 6.

FIG. 7 is a partial illustration of the actuation rod 47 of the bearing block 100 for the lever 51, in an enlarged view. The peg 52 is attached to the lever 51. The clamping lever 65 and the retaining member 89 are also illustrated. It can be appreciated from FIGS. 7 and 8 that the retaining member 89 includes an inside splined profile 105 that serves to capture the periphery of the workpiece 43.

Figure 8:
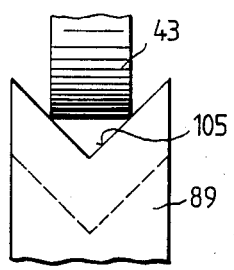
FIG. 8 is another detailed illustration of a portion of the device of FIG. 6.

Further details of the clamping mechanism can be derived from FIGS. 8 and 9. The clamping lever 65 is attached to the bearing block 106 via a flexural pivot 102. Due to the influence of the leaf springs within the flexural pivot 102, the flexural pivot 102 itself can be pre-stressed to bias the clamping member 65. The bearing block 106 is rigidly screwed to the workpiece carrier 92

As discussed previously, the lever 65 of the clamping member is pre-stressed. The pre-stress is generated by the leaf spring 82. A first end of the leaf spring is connected to the bearing block 106 at the point 107. A second end of the leaf spring is attached to the clamping lever 65 at point 108 by a screw. The leaf spring is pre-stressed in the position shown in FIG. 9 so that it attempts to rotate the clamping lever 65 in the direction of the arrow 109. The above-described peg 52 opposes the turning.

When, as set forth in conjunction with FIG. 11, the peg 52 is pivoted in the direction of the arrow 58, the hardened retaining member 89 engages the outer periphery 90 of the workpiece 43. Simultaneously, the clamping lever 65 abuts against a retaining screw 93.

The workpiece is held centered within the receptacle opening in this fashion.

While a preferred embodiment has been shown, modifications and changes may become apparent to those skilled in the art which shall fall within the spirit and scope of the invention. It is intended that such modifications and changes be covered by the attached claims.

We claim as our invention:

1. In a vacuum coating apparatus having a workpiece carrier for conveying at least one workpiece between station positions within a process chamber, one station being a transfer station for the transfer of workpiece into and out from the process chamber, a device for retaining and holding the workpiece on the carrier comprising:
   a crank-lever mechanism positioned at the transfer station; and
   a clamping mechanism operatively mounted on the workpiece carrier, the crank-lever mechanism operatively interacting with the clamping mechanism to cause same to selectively grasp or release the workpiece.

2. In the apparatus of claim 1, wherein the crank lever mechanism is mounted within an airlock chamber of the workpiece transfer station.

3. In the apparatus of claim 2, wherein the airlock chamber comprises a connecting sleeve member and the crank lever system is mounted at one end of the connecting sleeve member forming the airlock chamber.

4. In the apparatus of claim 1, the crank-lever mechanism comprising a rotatable crank plate to which are connected at least three connecting rods, each rod connected to means for actuating a clamping member of the clamping mechanism.

5. In the apparatus of claim 4, the means for actuating the clamping member comprising a seesaw type lever that is pivotally attached to the process chamber at the transfer station.

6. In the apparatus of claim 4, the workpiece carrier comprising at least one circular receptacle opening within which the workpiece is received and carried, each means for actuating a clamping member being positioned about an outer periphery of the receptacle opening, whenever the receptacle opening is in registry with the transfer station.

7. In the apparatus of claim 6, the means for actuating the clamping member being spaced apart about the periphery by about 120°.

8. In the apparatus of claim 1, the clamping mechanism comprising:
   (a) a plurality of levers pivotally mounted on the workpiece carrier for operatively contacting the workpiece; and
   (b) means for biasing the levers into engagement with the workpiece.

9. In the apparatus of claim 8, wherein the means for biasing comprises a plurality of leaf springs.

10. In the apparatus of claim 8, the clamping mechanism further comprising a flexural pivot having a restoring force sufficient to bias the lever into clamping engagement with the workpiece.

11. In the apparatus of claim 8, wherein the levers of the clamping mechanism centrally align the workpiece with respect to the receptacle.

12. In the apparatus of claim 8, the workpiece carrier comprising a rotating ring-shaped disk having one or more receptacle openings, the workpiece carrier rotating within the process chamber, each clamping mechanism including at least three clamping members positioned about its respective receptacle opening.

13. A vacuum coating apparatus, comprising:
   (a) a vacuum tight sealable process chamber means for applying a coating to a workpiece
   (b) a transfer station for the transfer of a workpiece into and out from the process chamber;
   (c) a workpiece carrier rotatably positioned within the process chamber for conveying the workpiece from position-to-position within the process chamber;
   (d) a clamping device operatively mounted on said carrier for releasably securing the workpiece on the carrier; and
   (e) an actuating device operatively mounted on said process chamber at said transfer station that cooperates and interacts with the clamping device to cause the clamping device to release and secure said workpiece.

14. The vacuum coating apparatus of claim 13, wherein the clamping device comprises:
   the plurality of levers pivotally mounted on the workpiece carrier for operatively contacting the workpiece; and
   (b) means for biasing the levers into engagement with the workpiece.

15. The vacuum coating apparatus of claim 13, wherein the actuating device comprises, a rotatable crank plate to which are connected at least three connecting rods, each rod connected to means for actuating a clamping member of the clamping device.

16. The vacuum coating apparatus of claim 13, wherein the workpiece carrier comprises at least one circular receptacle opening within which the workpiece is received and carried, each means for actuating a clamping member being positioned about an outer periphery of the receptacle opening whenever the opening is in registry with the transfer station 17. A vacuum coating apparatus, comprising:
   (a) a vacuum sealable process chamber means for applying a coating to a workpiece;
   (b) a workpiece carrier positioned within the chamber for conveying a workpiece from position-to-position within the chamber;
   (c) a transfer station located at one position of the process chamber, the transfer station including a sealable opening through which a workpiece is transferred into and out from the chamber;
   (d) at least one receptacle positioned on the carrier for receiving therein the workpiece;
   (e) a clamping mechanism positioned about the receptacle for releasably securing the workpiece on the carrier, the clamping mechanism including first levers positioned about a periphery of the receptacle, the first levers being biased toward a central point so as to retain therebetween the workpiece when in an inward pivoted position;
   (f) a crank-lever mechanism positioned about the opening of the transfer station within the chamber, the crank-lever mechanism operatively interacting with the clamping mechanism to cause same to release or secure the workpiece, the crank-lever mechanism including a rotatable crank plate and actuation rods pivotally attached at one end to the crank plate and attached at another end to second levers, the second levers having extensions that operatively selectively abut against the first levers to restrain and release same.

18. The vacuum coating apparatus of claim 17, wherein the second levers comprise seesaw type levers having central fulcrums about which the levers pivot.

19. The vacuum coating apparatus of claim 17, wherein the receptacle comprises an opening within which the workpiece is received and carried.

20. The vacuum coating apparatus of claim 17, wherein the first levers are biased toward a central point by means of leaf springs.

* * * * *